United States Patent
Kuo et al.

(10) Patent No.: US 9,207,290 B2
(45) Date of Patent: Dec. 8, 2015

(54) MAGNETIC FIELD SENSOR FOR SENSING EXTERNAL MAGNETIC FIELD

(71) Applicant: Industrial Technology Research Institute, Hsinchu (TW)

(72) Inventors: Keng-Ming Kuo, Hsinchu (TW); Ding-Yeong Wang, Hsinchu (TW); Yung-Hung Wang, Hsinchu (TW)

(73) Assignee: Industrial Technology Research Institute, Chutung Township, Hsinchu County (TW)

( * ) Notice: Subject to any disclaimer, the term of this patent is extended or adjusted under 35 U.S.C. 154(b) by 314 days.

(21) Appl. No.: 13/730,534

(22) Filed: Dec. 28, 2012

(65) Prior Publication Data

US 2014/0111195 A1 Apr. 24, 2014

(30) Foreign Application Priority Data

Oct. 22, 2012 (TW) .............................. 101138875 A

(51) Int. Cl.
*G01R 33/02* (2006.01)
*G01R 33/06* (2006.01)
(Continued)

(52) U.S. Cl.
CPC .............. *G01R 33/06* (2013.01); *G01R 33/098* (2013.01); *H01L 21/00* (2013.01); *G11B 3/00* (2013.01); *H01L 2221/00* (2013.01)

(58) Field of Classification Search
CPC ...... H01L 21/00; H01L 2221/00; G01R 1/00; G11B 3/00; G11B 2209/00; H01F 1/00; G01N 1/00; G01N 2201/00
USPC ............ 324/219, 207.21, 230, 242–244, 252, 324/260
See application file for complete search history.

(56) References Cited

U.S. PATENT DOCUMENTS

| 6,984,978 | B2 | 1/2006 | Wan et al. |
| 7,054,114 | B2 | 5/2006 | Jander et al. |

(Continued)

FOREIGN PATENT DOCUMENTS

| CN | 101000943 A | 7/2007 |
| EP | 2 458 395 A1 | 5/2012 |
| TW | 201133016 A1 | 10/2011 |
| TW | I350588 B | 10/2011 |
| TW | 201213833 A | 4/2012 |

OTHER PUBLICATIONS

Alexander et al., "Switching Time and Current Reduction Using a Composite Free Layer in Magnetic Tunnel Junctions," Int'l Semiconductor Device Research Symp. ISDRS, pp. 1-2 (2011).

(Continued)

*Primary Examiner* — Huy Q Phan
*Assistant Examiner* — Temilade Rhodes-Vivour
(74) *Attorney, Agent, or Firm* — Muncy, Geissler, Olds & Lowe, P.C.

(57) ABSTRACT

A magnetic field sensor for sensing an external magnetic field is disclosed. The magnetic field sensor includes at least two magnetic tunneling junction (MTJ) elements disposed on an underlying electrode. Each of the MTJ elements is formed by a synthetic antiferromagnetic layer, a barrier layer and a free layer sequentially stacked together. A top electrode is then connected to the free layers. The free layer can be a single free layer, a composite free layer, a synthetic antiferromagnetic free layer or an alloy free layer. When a current is applied to a metal circuit passing over or below the MTJ elements, free magnetic moments generated by the MTJ elements are anti-parallel to each other along a reference axis, and the angles between the magnetic moments created by the MTJ elements and the reference axis are 40 to 50 degrees and 130 to 140 degrees, respectively.

12 Claims, 7 Drawing Sheets

(51) Int. Cl.
*H01L 21/00* (2006.01)
*G01R 33/09* (2006.01)
*G11B 3/00* (2006.01)

(56) References Cited

U.S. PATENT DOCUMENTS

| | | | |
|---|---|---|---|
| 7,071,009 B2 * | 7/2006 | Wang et al. | 438/3 |
| 7,602,590 B2 | 10/2009 | Zhao et al. | |
| 7,800,868 B2 | 9/2010 | Gao et al. | |
| 8,059,374 B2 | 11/2011 | Zhao et al. | |
| 8,390,283 B2 * | 3/2013 | Mather et al. | 324/252 |
| 2006/0061350 A1 * | 3/2006 | Myers et al. | 324/117 R |
| 2009/0121710 A1 | 5/2009 | Wang et al. | |
| 2010/0177449 A1 | 7/2010 | Zhao et al. | |
| 2010/0247966 A1 | 9/2010 | Zhao et al. | |
| 2011/0002163 A1 * | 1/2011 | Fukami et al. | 365/173 |
| 2011/0007427 A1 * | 1/2011 | Qiu et al. | 360/319 |
| 2011/0068786 A1 * | 3/2011 | Ohta et al. | 324/252 |
| 2011/0227560 A1 * | 9/2011 | Haratani et al. | 324/117 R |
| 2012/0068698 A1 | 3/2012 | Chen et al. | |

OTHER PUBLICATIONS

Lee et al., "Effect of Interlayer Coupling in COFeB/Ta/NiFe Free Layers on the Critical Switching Current of MgO-based Magnetic Tunnel Junctions," J. Appl. Phys., vol. 106, No. 2, pp. 024513-1-024513-4 (2009).

Yao et al., "Observation of Intermediate States in Magnetic Tunnel Junctions With Composite Free Layer," IEEE Trans. On Magnetics, vol. 44, No. 11, pp. 2496-2499 (Nov. 2008).

Meng et al., "Composite Free Layer for High Density Magnetic Random Access Memory with Lower Spin Transfer Current," Appl. Phys. Letts., vol. 89, No. 15, pp. 152509-1-152509-3 (2006).

Fermon et al., "Optimised GMR Sensors for Low and High Frequencies Applications," Sensors and Actuators A, vol. 129, No. 1-2, pp. 203-206 (May 24, 2006).

Shah et al., "Magnetic Tunneling Junction Based Magnetic Field Sensors: Role of Shape Anisotropy Versus Free Layer Thickness," J. of Appl. Phys., vol. 109, 07C731-1-07C731-3 (2011).

Egelhoff et al., "Magnetic Tunnel Junctions With Large Tunneling Magnetoresistance and Small Saturation Fields," J. of Appl. Phys., vol. 107, pp. 09C705-1-09C705-2 (2010).

Teixeira et al., "Evidence of Spin-Polarized Direct Elastic Tunneling and Onset of Superparamagnetism in MgO Magnetic Tunnel Junction," Phys. Rev., vol. 81, pp. 134423-1-134423-8 (2010).

Almeida et al., "Field Detection in Single and Double Barrier MgO Magnetic Tunnel Junction Sensors," J. of Appl. Phys., vol. 103, pp. 07E922-07E922-3 (2008).

Nazarov et al., "Tunable Ferromagnetic Resonance Peak in Tunneling Magnetoresistive Sensor Structures," Appl. Phys. Letts., vol. 81, pp. 4559-4561 (2002).

* cited by examiner

MAGNETIC FIELD SENSOR FOR SENSING EXTERNAL MAGNETIC FIELD

CROSS-REFERENCE TO RELATED APPLICATIONS

This application claimed priority to Taiwanese Patent Application No. 101138875, filed on Oct. 22, 2012. The entirety of the above-mentioned patent application is hereby incorporated by reference herein and made a part of this specification.

TECHNICAL FIELD

The disclosure relates to a sensor technique, and relates to a free layer structure for sensing an external magnetic field and a magnetic field sensor having the free layer structure.

BACKGROUND

Electronic products used in daily lives continue to evolve due to advances in technology, for example, smaller and more powerful mobile phones are being developed that provide personalized global positioning and navigation functions, and therefore need a variety of sensors for condition detection. Currently, most of the magnetic field sensors utilizing magnetic field sensing principle are Hall sensors and biaxial anisotropic magneto-resistor G sensors (AMR G sensors), but these still have the issues of bulky volume, low sensitivity and etc. In addition, tunneling magneto-resistive sensors (TMR sensors) provide good sensitivity and small volume. The TMR sensors are only suitable for the production of single axial sensing rather than electronic compasses due to low sensing linearity.

Based on the shortcomings of the aforementioned various sensors, a complementary tunneling magneto-resistive structure has been proposed. Two TMR sensors are connected in parallel to complement each other, thereby resolving the issue of poor sensing linearity. In a TMR magnetic field sensor, in-plane magnetic anisotropy (IMA) materials are generally used as the magnetic layers in a magnetic tunneling junction (MTJ). A MTJ structure typically consists of a thin and non-magnetic dielectric layer and magnetic layers above and below the non-magnetic dielectric layer. A pinned layer, a tunneling layer and a free layer are also included. Signal output of the TMR magnetic field sensor is achieved by employing a single horizontal annealing field to set the magnetization direction of the X-Y axial fixing layer (as a reference layer), and detecting the direction of an externally-applied magnetic field by determining the changes in resistance caused by the difference between the magnetization direction of pinned layer and the magnetization direction of the free layer (as a sensing layer) modified by the externally-applied magnetic field. When there is no external magnetic field, the magnetization direction of the free layer remains in the lowest energy state, thus the initial state of the magnetization direction of the free layer can be controlled by crystalline anisotropy, the shape anisotropy, current field, demagnetization field, and etc.

Although the complementary tunneling magneto-resistive structure solves the problem of poor linearity in magnetic field sensing, it is the trend to improve the sensitivity and linearity of the complementary tunneling magneto-resistive structure.

SUMMARY

The disclosure provides a magnetic field sensor for sensing an external magnetic field. The magnetic field sensor includes: a first electrode and a second electrode disposed on a substrate; a first magnetic tunneling junction (MTJ) element and a second MTJ element disposed between and connected in parallel with the first and the second electrodes, the first and the second MTJ elements being disposed along a reference axis of the magnetic field sensor, wherein the first MTJ element includes a first antiferromagnetic layer having a first pinned magnetic moment, a first free layer having a first free magnetic moment and a barrier layer formed between the first antiferromagnetic layer and the first free layer, and the first free layer is a multilayer structure, and wherein the second MTJ element includes a second antiferromagnetic layer having a second pinned magnetic moment, a second free layer having a second magnetic moment and a barrier layer formed between the second antiferromagnetic layer and the second free layer, and the second free layer is a multilayer structure; and a metal circuit passing over or below the first and the second MTJ elements, such that the first free magnetic moment and the second free magnetic moment are anti-parallel to each other along the reference axis, and the first pinned magnetic moment and the second pinned magnetic moment form angles of 45 or 135 degrees with the reference axis, respectively, including an error value within a range of ±5 degrees. For example, the first pinned magnetic moment and the second pinned magnetic moment form angles of 40~50 and 130~140 degrees with the reference axis, respectively. However, the angles that achieve the effects of the disclosure are not limited to these ranges described herein.

The disclosure further provides a magnetic field sensor for sensing an external magnetic field, which may include: a first electrode and a second electrode disposed on a substrate; a first magnetic tunneling junction (MTJ) element and a second MTJ element disposed between and connected in parallel with the first and the second electrodes, the first and the second MTJ elements being disposed along a reference axis of the magnetic field sensor, wherein the first MTJ element includes a first antiferromagnetic layer having a first pinned magnetic moment, a first free layer having a first free magnetic moment and a barrier layer formed between the first antiferromagnetic layer and the first free layer, and wherein the second MTJ element includes a second antiferromagnetic layer having a second pinned magnetic moment, a second free layer having a second free magnetic moment and a barrier layer formed between the second antiferromagnetic layer and the second free layer, and the second antiferromagnetic layer includes a synthetic antiferromagnetic layer having a pinned layer, a ruthenium layer and a reference layer; and a metal circuit passing over or below the first and the second MTJ elements, such that the first free magnetic moment and the second free magnetic moment are anti-parallel to each other along the reference axis, and the first pinned magnetic moment and the second pinned magnetic moment form angles of 40~50 and 130~140 degrees with the reference axis, respectively. Further, the first pinned magnetic moment and the second pinned magnetic moment form angles of 45 or 135 degrees with the reference axis, respectively. Each of the first and the second free layers may be a single free layer or an alloy free layer.

The disclosure further provides a biaxial magnetic field sensor, which may include: a first magnetic field sensor having a first fixed direction and a first reference axis; and a second magnetic field sensor having a second fixed direction and a second reference axis, the first and the second reference axes form a 90-degree angle, and the first and the second fixed directions are parallel to each other and form 45-degree angles with the first and the second reference axes, respectively. The first magnetic field sensor may include a first electrode and a second electrode disposed on a first substrate; a first magnetic tunneling junction (MTJ) element and a second MTJ element disposed between and connected in parallel with the first and the second electrodes, the first and the second MTJ elements being disposed along the first reference axis of the first magnetic field sensor, wherein the first MTJ element may include a first antiferromagnetic layer having a first pinned magnetic moment in the first fixed direction, a first free layer having a first free magnetic moment and a barrier layer formed between the first antiferromagnetic layer and the first free layer, and the first free layer is a multilayer structure, and wherein the second MTJ element may include a second antiferromagnetic layer having a second pinned magnetic moment in the first fixed direction, a second free layer having a second magnetic moment and a barrier layer formed between the second antiferromagnetic layer and the second free layer, and the second free layer is a multilayer structure; and a first metal circuit passing over or below the first and the second MTJ elements, such that the first free magnetic moment and the second free magnetic moment are anti-parallel to each other along the first reference axis, and the first pinned magnetic moment and the second pinned magnetic moment form angles of 40~50 or 130~140 degrees with the reference axis, respectively, and further, the first pinned magnetic moment and the second pinned magnetic moment form angles of 45 and 135 degrees with the reference axis, respectively, and the magnetic field sensing direction of the first magnetic field sensor is perpendicular to the first reference axis. The second magnetic field sensor may include a third electrode and a fourth electrode disposed on a second substrate; a third MTJ element and a fourth MTJ element disposed between and connected in parallel with the third and the fourth electrodes, the third and the fourth MTJ elements being disposed along the second reference axis of the second magnetic field sensor, wherein the third MTJ element may include a third antiferromagnetic layer having a third pinned magnetic moment in the second fixed direction, a third free layer having a third free magnetic moment and a barrier layer formed between the third antiferromagnetic layer and the third free layer, and the third free layer is a multilayer structure, and wherein the fourth MTJ element may include a fourth antiferromagnetic layer having a fourth pinned magnetic moment in the second fixed direction, a fourth free layer having a fourth free magnetic moment and a barrier layer formed between the fourth antiferromagnetic layer and the fourth free layer, and the fourth free layer is a multilayer structure; and a second metal circuit passing over or below the third and the fourth MTJ elements, such that the third free magnetic moment and the fourth free magnetic moment are anti-parallel to each other along the second reference axis, and the third pinned magnetic moment and the fourth pinned magnetic moment form angles of 40~50 or 130~140 degrees with the second reference axis, respectively, and further, the third pinned magnetic moment and the fourth pinned magnetic moment form angles of 45 or 135 degrees with the second reference axis, respectively, and the magnetic field sensing direction of the second magnetic field sensor is perpendicular to the second reference axis.

The disclosure further provides a biaxial magnetic field sensor, which may include a first magnetic field sensor having a first fixed direction and a first reference axis; and a second magnetic field sensor having a second fixed direction and a second reference axis, the first and the second reference axes form a 90-degree angle, and the first and the second fixed directions are parallel to each other and form 45-degree angles with the first and the second reference axes, respectively. The first magnetic field sensor may include a first electrode and a second electrode provided on a first substrate; a first magnetic tunneling junction (MTJ) element and a second MTJ element disposed between and connected in parallel with the first and the second electrodes, the first and the second MTJ elements being disposed along the first reference axis of the first magnetic field sensor, wherein the first MTJ element includes a first antiferromagnetic layer having a first pinned magnetic moment in the first fixed direction, a first free layer having a first free magnetic moment and a barrier layer formed between the first antiferromagnetic layer and the first free layer, and the first antiferromagnetic layer includes a synthetic antiferromagnetic layer having a pinned layer, a ruthenium layer and a reference layer, and wherein the second MTJ element includes a second antiferromagnetic layer having a second pinned magnetic moment in the first fixed direction, a second free layer having a second magnetic moment and a barrier layer formed between the second antiferromagnetic layer and the second free layer, and the second antiferromagnetic layer includes a synthetic antiferromagnetic layer having a pinned layer, a ruthenium layer and a reference layer; and a first metal circuit passing over or below the first and the second MTJ elements, such that the first free magnetic moment and the second free magnetic moment are anti-parallel to each other along the first reference axis, and the first pinned magnetic moment and the second pinned magnetic moment form angles of 40~50 or 130~140 degrees with the reference axis, respectively, and further, the first pinned magnetic moment and the second pinned magnetic moment form angles of 45 or 135 degrees with the reference axis, respectively, and the magnetic field sensing direction of the first magnetic field sensor is perpendicular to the first reference axis. The second magnetic field sensor may include a third electrode and a fourth electrode disposed on a second substrate; a third MTJ element and a fourth MTJ element disposed between and connected in parallel with the third and the fourth electrodes, the third and the fourth MTJ elements being disposed along the second reference axis of the second magnetic field sensor, wherein the third MTJ element may include a third antiferromagnetic layer having a third pinned magnetic moment in the second fixed direction, a third free layer having a third free magnetic moment and a barrier layer formed between the third antiferromagnetic layer and the third free layer, and the third antiferromagnetic layer includes a synthetic antiferromagnetic layer having a pinned layer, a ruthenium layer and a reference layer, and wherein the fourth MTJ element may include a fourth antiferromagnetic layer having a fourth pinned magnetic moment in the second fixed direction, a fourth free layer having a fourth free magnetic moment and a barrier layer formed between the fourth antiferromagnetic layer and the fourth free layer, and the fourth antiferromagnetic layer includes a synthetic antiferromagnetic layer having a pinned layer, a ruthenium layer and a reference layer; and a second metal circuit passing over or below the third and the fourth MTJ elements, such that the third free magnetic moment and the fourth free magnetic moment are anti-parallel to each other along the second reference axis, and the third pinned magnetic moment and the fourth pinned magnetic moment form angles of 40~50 or 130~140 degrees with the second reference axis, respectively, and further, the third pinned magnetic moment and the fourth pinned magnetic moment form angles of 45 or 135 degrees with the second reference axis, respectively, and the magnetic field sensing direction of the second magnetic field sensor is perpendicular to the second reference axis.

BRIEF DESCRIPTION OF THE DRAWINGS

The disclosure can be more fully understood by reading the following detailed description of the preferred embodiments, with reference made to the accompanying drawings, wherein.

DETAILED DESCRIPTION OF DISCLOSED EMBODIMENTS

Figure 1A:
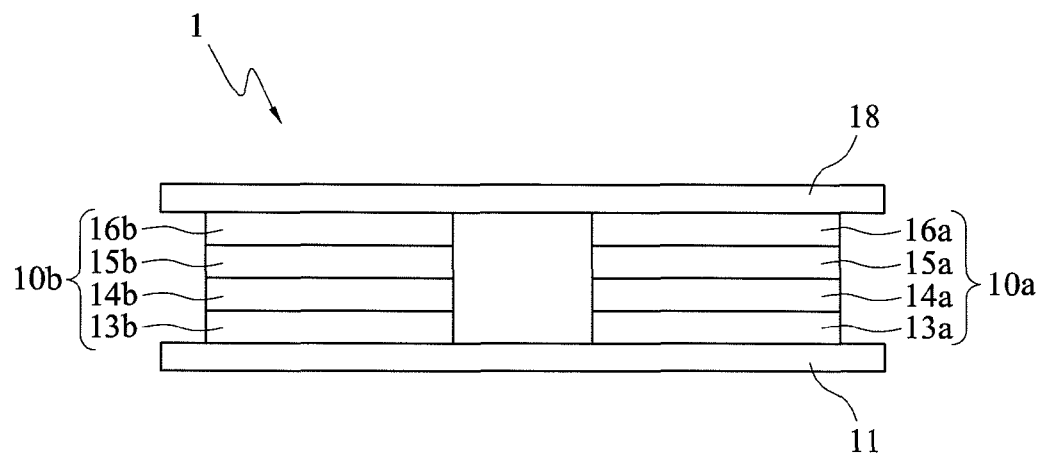
FIGS. 1A and 1B are diagram illustrating a cross-sectional view and a top view of the structure of a magnetic field sensor for sensing external magnetic field according to the disclosure, respectively.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
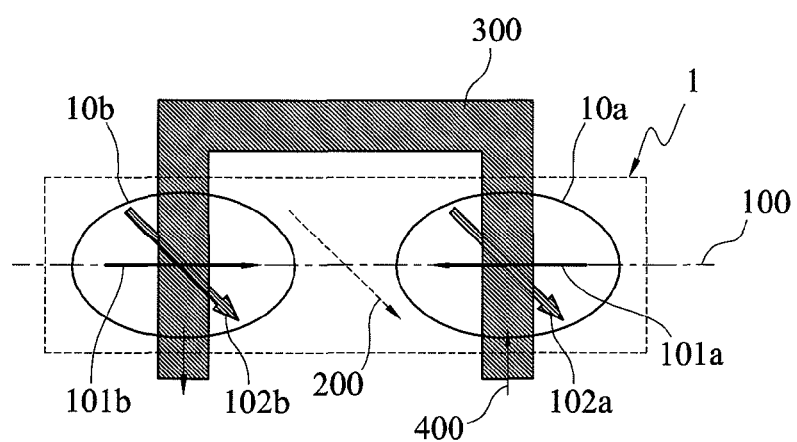

FIG. 1A is a diagram illustrating a cross-sectional view of the structure of a magnetic field sensor for sensing external magnetic field according to the disclosure, and FIG. 1B is a diagram illustrating a top view of the structure of the magnetic field sensor for sensing external magnetic field according to the disclosure. The magnetic field sensor 1 obtains a conductance G due to changes in the external magnetic field, thereby sensing conditions. As shown in FIG. 1A, the magnetic field sensor 1 includes a first electrode 11, a first magnetic tunneling junction (MTJ) element 10a, a second MTJ element 10b, a second electrode 18 and a metal circuit 300. The aforementioned elements may be provided on a substrate (not shown), wherein the first MTJ element 10a and the second MTJ element 10b are located between the first electrode 11 and the second electrode 18, and connected in parallel to the first electrode 11 and the second electrode 18. The first MTJ element 10a and the second MTJ element 10b are disposed along a reference axis 100 of the magnetic field sensor 1.

Referring to FIGS. 1A and 1B, the first MTJ element 10a is disposed on the first electrode 11, wherein a first antiferromagnetic layer 14a, a first barrier layer 15a and a first free layer 16a are sequentially stacked. The first MTJ element 10a forms a first pinned magnetic moment 102a along a direction 200 through the first antiferromagnetic layer 14a, and the first free layer 16a of the first MTJ element 10a has a first free magnetic moment 101a parallel to the reference axis 100, wherein the reference axis 100 may be an easy axis.

The second MTJ element 10b is also located on the first electrode 11. The second MTJ element 10b has the structure as the first MTJ element 10a, including a second antiferromagnetic layer 14b, a second barrier layer 15b and a second free layer 16b. The second MTJ element 10b also has a second pinned magnetic moment 102b aligned in the direction 200, and the second free layer 16b of the second MTJ element 10b also has a second free magnetic moment 101b parallel to the reference axis 100.

The second electrode 18 is connected at the top of the first free layer 16a of the first MTJ element 10a and the second free layer 16b of the second MTJ element 10b. The metal circuit 300 passes through the top or bottom of the first MTJ element 10a and the second MTJ element 10b. Under the application of a fixed current 400, the first free magnetic moment 101a and the second free magnetic moment 101b become anti-parallel to each other and parallel to the reference axis 100, and the first and second pinned magnetic moments 102a and 102b of the first and second MTJ elements 10a and 10b form an angle of about 40~50 degrees and an angle of 130~140 degrees with the reference axis 100, respectively. Further, in an exemplary embodiment, the first pinned magnetic moment 102a and the second pinned magnetic moment 102b form an angle of 45 degrees and 135 degrees, respectively, with the reference axis 100. In other words, when the fixed current 400 is applied, current passes through the metal circuit 300 and passes over or below the first MTJ element 10a and the second MTJ element 10b, generating respective magnetic moments. Thus, without the change of an external magnetic field, the first and second pinned magnetic moments 102a and 102b of the first and second MTJ elements 10a and 10b form an angle of about 40~50 degrees and an angle of 130~140 degrees with the reference axis 100, respectively. More particularly, the first pinned magnetic moment 102a and the second pinned magnetic moment 102b form an angle of 45 degrees and 135 degrees, respectively, with the reference axis 100. The foregoing angles are dependent on the direction of the current. In FIG. 1B, the first free magnetic moment 101a and the second free magnetic moment 101b are anti-parallel to each other along the reference axis 100, such that the first pinned magnetic moment 102a and the first free magnetic moment 101a of the first MTJ element 10a form an angle of 135 degrees, and the second pinned magnetic moment 102b and the second free magnetic moment 101b of the second MTJ element 10b form an angle of 45 degrees.

More particularly, the first MTJ element 10a and a second MTJ element 10b have a collinear reference axis 100, wherein in an exemplary embodiment, the first antiferromagnetic layer 14a of the first MTJ element 10a formed above the first electrode 11 in FIG. 1A is made of a magnetic material such as cobalt-iron (CoFe), nickel-iron (NiFe) material, or the like, which has the first pinned magnetic moment 102a parallel to the direction 200. The direction 200 forms an angle of 45 degrees with the reference axis 100. In an exemplary embodiment, the first barrier layer 15a on the first antiferromagnetic layer 14a is made of a non-magnetic material, and the first free layer 16a on the first barrier layer 15a is made of a magnetic material, which has the first free magnetic moment 101a in parallel to the reference axis 100 without the influence of other external magnetic fields (i.e., the fixed current 400). Similarly, in an exemplary embodiment, the second antiferromagnetic layer 14b of the second MTJ element 10b formed above the first electrode 11 in FIG. 1A is made of a magnetic material, which has the second pinned magnetic moment 102b also parallel to the particular direction 200. The second barrier layer 15b on the second antiferromagnetic layer 14b is made of a non-magnetic material, and the second free layer 16b on the second barrier layer 15b is made of a magnetic material, which has the second free magnetic moment 101b in parallel to the reference axis 100 without the influence of other external magnetic fields, but the second free magnetic moment 101b and the first free magnetic moment 101a are anti-parallel to each other. According to FIG. 1B, in an exemplary embodiment, the first pinned magnetic moment 102a forms an angle of about 135 degrees with the reference axis 100, the second pinned magnetic moment 102b forms an angle of about 45 degrees with the reference axis 100, and the two angles can be swapped when the direction of the fixed current 400 is reversed.

The first and second MTJ elements 10a and 10b described above include the first and the second antiferromagnetic layers (14a and 14b), the first and the second free layers (16a and 16b) and the first and the second barrier layers (15a and 15b) between the antiferromagnetic layers and the free layers. In order to improve the sensing linearity and sensitivity of the free layer of the magnetic field sensor, the structures of the first and the second free layers 16a and 16b or the first and the second antiferromagnetic layers are further modified in the disclosure. In the following descriptions, the magnetic field sensor 1 will be described with different structures of the free layers.

In addition, when the first and the second antiferromagnetic layers 14a and 14b are used as antiferromagnetic pinned layers, antiferromagnetic layers 13a and 13b are further provided between the first and the second antiferromagnetic layers 14a and 14b to fix the magnetization directions of the first and the second antiferromagnetic layers 14a and 14b. In an exemplary embodiment, the materials used for the antiferromagnetic layers 13a and 13b may be made of platinum manganese (PtMn) or iridium manganese (IrMn) with a thickness ranging between 1 to 100 nm. Thus, the magnetization directions of the first and the second antiferromagnetic layers 14a and 14b are fixed when the first and the second antiferromagnetic layers 14a and 14b are used as the pinned layers.

Figure 2:
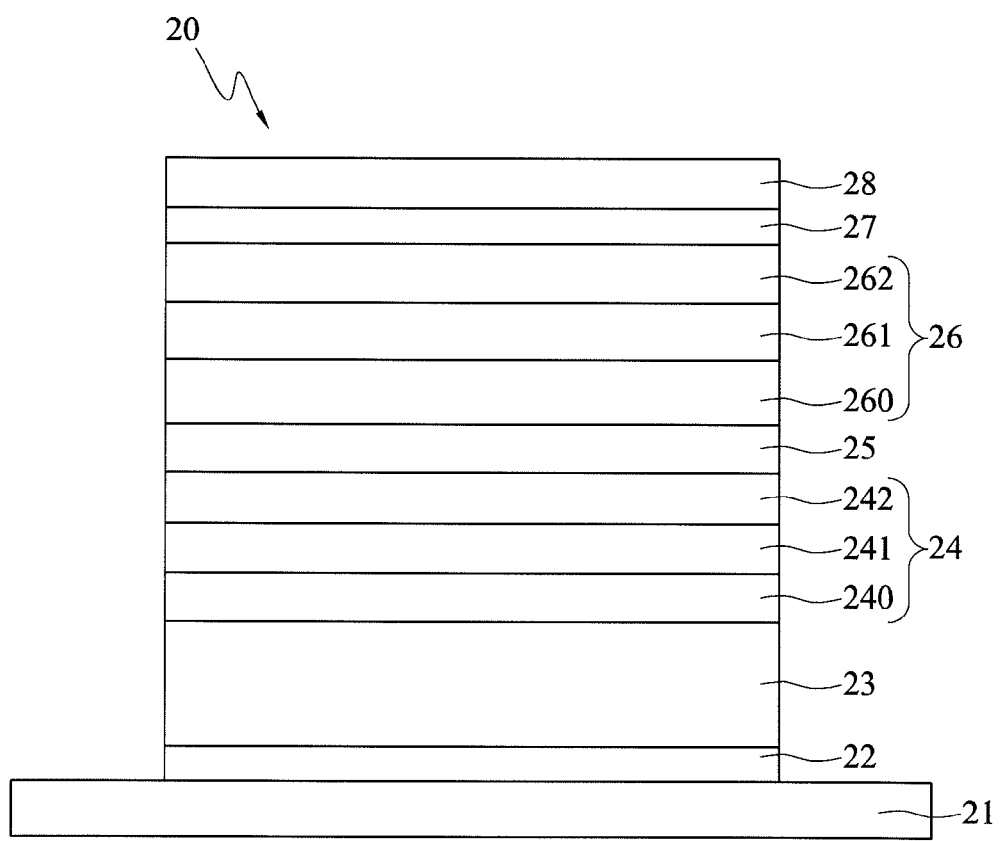
FIG. 2 is a schematic diagram depicting the structure of a MTJ element of the magnetic field sensor according to the disclosure.

As shown in FIG. 2, a schematic diagram depicting the structure of a MTJ element of the magnetic field sensor according to the disclosure is shown. For example, the MTJ element may be the embodiment of the first or second MTJ element 10a or 10b. In FIG. 2, a MTJ element 20 may have a bottom-pinned structure or a top-pinned structure depending on the location of the pinned layer. The following descriptions are illustrated according to the example of bottom-pinned layer. Apart from the first electrode 21 and the second electrode 28 at the bottom and top of the MTJ element 20, there are a seed layer 22, an antiferromagnetic (AFM) layer 23, a synthetic antiferromagnetic layer 24, a barrier layer 25, a free layer 26, and a capping layer 27 between the first electrode 21 and the second electrode 28. The synthetic antiferromagnetic layer 24 may be a multilayer structure, which includes a pinned layer 240, a ruthenium layer 241 and a reference layer 242.

The seed layer 22 is a buffer layer. In an exemplary embodiment, the material used for forming the seed layer 22 may be Ta, Ta/NiFe, Ta/Ru/Ta, Ta/Cr, Ta/Cu . . . , etc. with a thickness ranging from 1 to 100 nm. The seed layer 22 can improve interface planarization and a uniform lattice structure with characteristic directions. In an exemplary embodiment, the material used for the antiferromagnetic layer 23 may be PtMn or IrMn with a thickness range of 1~100 nm. It is used for pinning the direction of magnetization of the pinned layer 240 of the synthetic antiferromagnetic layer 24. It can also be used to control process parameters in order to modify crystal orientation and surface planarization based on requirements.

The synthetic antiferromagnetic layer 24 is a typical synthetic antiferromagnetic structure, including a non-ferromagnetic material (such as ruthenium in an exemplary embodiment) embedded between two ferromagnetic material layers. The reference layer 242 and the pinned layer 240 may be made of ferromagnetic materials such as Co, Fe, CoFe, NiFe or CoFeB, or a laminated combination of the above materials. When the ruthenium layer 241 has a thickness of 0.6~1 nm, the magnetization directions of the two ferromagnetic layers can be rendered into an anti-parallel state, that is, the magnetization direction of the upper reference layer and the magnetization direction of the lower pinned layer are parallel but reverse to each other. As such, a closed magnetic line of force can be formed, and the exchange coupling effect is determined based on the thickness of the ruthenium layer 241.

The interface of the barrier layer 25 is made of CoFeB, and a high tunneling magneto-resistance change rate can be obtained. Embedding a ferromagnetic material, such as CoFe in an exemplary embodiment, between the ruthenium layer 241 and the reference layer 242 of non-ferromagnetic materials helps to improve the formation of crystallinity of the body-centered cubic (bcc) crystalline and the pinning strength. The net magnetic moment and stray field of the overall device are made close to 0 by adjusting the thickness of the reference layer 242. In doing so, asymmetric component switching can be avoided. In addition, in an exemplary embodiment, the barrier layer 25 may be made of materials, such as aluminum oxide or magnesium oxide, and its thickness range is between 1 to 4 nm.

In the disclosure, the free layer 26 may have various structures. The free layer 26 may be a composite free layer, a synthetic antiferromagnetic free layer (SAF free layer), a single free layer, or an alloys free layer. In any of the aforementioned free layer structures, a high linear relationship (R-square≥0.999) between the parallel conductance G value and changes in the applied magnetic field is obtained.

For a composite free layer, as shown in FIG. 2, the free layer 26 includes a lower free layer 260, a spacer layer 261 and an upper free layer 262. In an exemplary embodiment, the materials for the lower free layer 260 and the upper free layer 262 may include NiFe, NiFeTa, NiFeCoTa, NiFeRu, NiFeCoRu, $(NiFe/Ta)_m$, $(NiFe/Ru)_m$, $(NiFeCo/Ta)_m$ or $(NiFeCo/Ru)_m$.

In an exemplary embodiment, in the composite free layer, the spacer layer 261 can be non-ferromagnetic tantalum (Ta), and thus by adjusting the thickness of tantalum, multiple parallel exchange coupling effects can be generated for the two ferromagnetic lower and upper free layers 260 and 262. For example, the thickness of the spacer layer 261 is between 0.1 and 1 nm, and the lower free layer 260 and the upper free layer 262 are parallel coupled.

Further, if the spacer layer 261 is made of non-magnetic ruthenium (Ru), the coupling effect will be different from the above. The two ferromagnetic lower and upper free layers 260 and 262 change with the thickness of Ru, and apart from exhibiting two different magnetization arrangements (i.e. parallel and anti-parallel), the coupling strength becomes weaker when the thickness of the spacer layer 261 (non-magnetic Ru) increases. For example, at a Ru thickness of 0.3 nm, they are parallel strongly coupled. As the thickness of Ru increases to 0.8 nm, they become anti-parallel strongly coupled. As the thickness of Ru further increases to 1.4 nm, they become parallel weakly coupled.

In an exemplary embodiment, when the spacer layer 261 is a Ru layer with a thickness between 0.2 nm and 0.4 nm, the lower free layer 260 and the upper free layer 262 are parallel strongly coupled; and when the spacer layer 261 is a Ru layer with a thickness between 1.2 nm and 1.6 nm, then the lower free layer 260 and the upper free layer 262 are parallel weakly coupled. These two are in parallel coupling, and are of the composite free layer structure.

In addition, when the spacer layer 261 is a Ru layer with a thickness between 0.6 nm and 1 nm, the lower free layer 260 and the upper free layer 262 are anti-parallel strongly coupled; and when the spacer layer 261 is a Ru layer with a thickness between 1.9 nm and 2.3 nm, then the lower free layer 260 and the upper free layer 262 are anti-parallel weakly coupled. These two are in anti-parallel coupling, and are of the synthetic antiferromagnetic free layer structure.

Further, in an exemplary embodiment, when the free layer 26 is a single free layer, that is, when the free layer 26 includes nickel-iron, common alloy materials can also be used as the free layer, such as NiFeTa, NiFeRu, NiFeCoTa or NiFeCoRu alloy.

Further, in an exemplary embodiment, the capping layer 27 is made of conductive materials that are not easily oxidized, and can be used to protect its underlying layers. In addition, during annealing at high temperatures, the material used for the capping layer 27 affects the crystallinity of the underlying ferromagnetic material. The material may include Ta, Ru, Ti, Cu, Ta/Ru, or etc.

The disclosure may adopt a structure of a composite antiferromagnetic layer, a barrier layer and a single free layer, a structure of a composite antiferromagnetic layer, a barrier layer and a composite free layer (synthetic free layer, alloy free layer, and etc.), a structure of a single antiferromagnetic layer, a barrier layer and a composite free layer or the like, which are all within the scope of the disclosure.

Figure 3A:
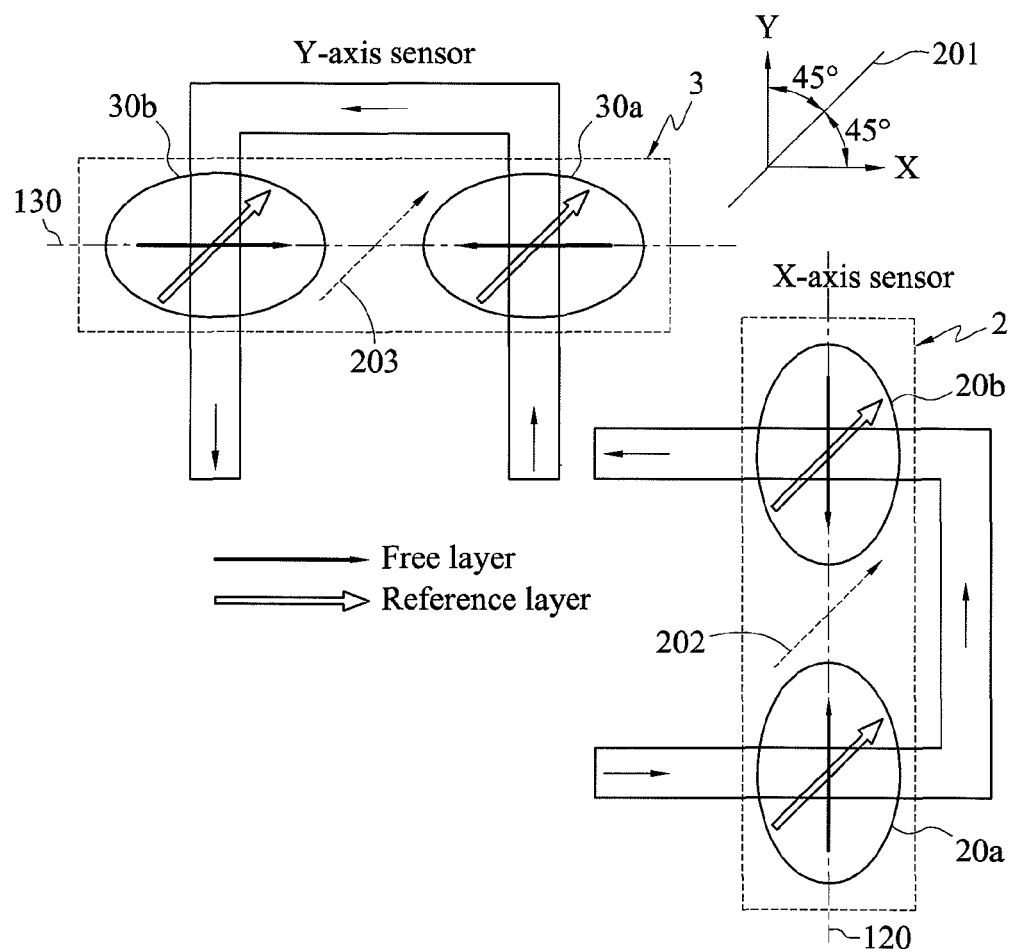
FIG. 3A is a schematic diagram illustrating an X-axis sensor and a Y-axis sensor according to the disclosure.

FIG. 3A is a schematic diagram illustrating an X-axis sensor and a Y-axis sensor according to the disclosure. The magnetic field sensor of the disclosure can be used as the X-axis sensor and Y-axis sensor. The sensors described herein include a pair of magnetic tunneling junction elements (hereinafter referred to as MTJ elements) of the same size. As shown in FIG. 3, in the pairs of MTJ elements, the angle between the magnetization directions of the free layer and reference layer is $\frac{1}{4}\pi$ in one of the sensors, and the angle between the magnetization directions of the free layer and reference layer is $\frac{3}{4}\pi$ in the other one of the sensors, wherein the direction of magnetization of the reference layer is defined by the annealing process, and the direction of magnetization of the free layer in the initial state stays in an easy axis of the lowest energy state due to anisotropy energy (as a reference axis for the magnetization direction), and the angles between the magnetization directions of the free layer and reference layer may exhibit $\frac{1}{4}\pi$ and $\frac{3}{4}\pi$ by adjusting the current field.

FIG. 3A shows a biaxial magnetic field sensor, which includes two magnetic field sensors, i.e. an X-axis sensor 2 and a Y-axis sensor 3, respectively. The X-axis sensor 2 has a first reference axis 120 and a first fixed direction 202. The first reference axis 120 is parallel to the Y axis. The Y-axis sensor 3 has a second reference axis 130 and a second fixed direction 203, and the second reference axis 130 is parallel to the X axis. The first reference axis 120 and the second reference axis 130 form a 90-degree angle. The first fixed direction 202 and the second fixed direction 203 are in parallel and form 45-degree angles with the first reference axis 120 and the second reference axis 130. The first fixed direction 202 and the second fixed direction 203 are in parallel with a direction 201 in the coordinates, and the first reference axis 120 and the second reference axis 130 form 45-degree angles with the direction 201.

Furthermore, the X-axis sensor 2 has a first MTJ element 20a and a second MTJ element 20b, and the Y-axis sensor 3 has a third MTJ element 30a and a fourth MTJ element 30b. The structures of the first, the second, the third and the fourth MTJ elements 20a, 20b, 30a and 30b are the same as those described in FIGS. 1A and 1B, and the relationship and actuations between the first and the second MTJ elements 20a and 20b as well as the relationship and actuations between the third and the fourth MTJ elements 30a and 30b are similar to those described with reference to FIGS. 1A and 1B, and will not be repeated here. The antiferromagnetic layers in the first, the second, the third and the fourth MTJ elements 20a, 20b, 30a and 30b can be composite antiferromagnetic layers or single antiferromagnetic layers, and the free layer a in the second, the third and the fourth MTJ elements 20a, 20b, 30a and 30b can be single free layers or composite free layers (synthetic free layer, alloy free layer etc.). In other words, with any combination of the above antiferromagnetic layers and free layers, e.g. a composite antiferromagnetic layer with a single free layer, a composite antiferromagnetic layer with a composite free layer, or a single antiferromagnetic layer with a composite free layer, a high linear relationship (R-square≥0.999) between the parallel conductance G value and changes in the applied magnetic field can be obtained, so as to improve the sensitivity and linearity of the magnetic field sensor.

Figure 3B:
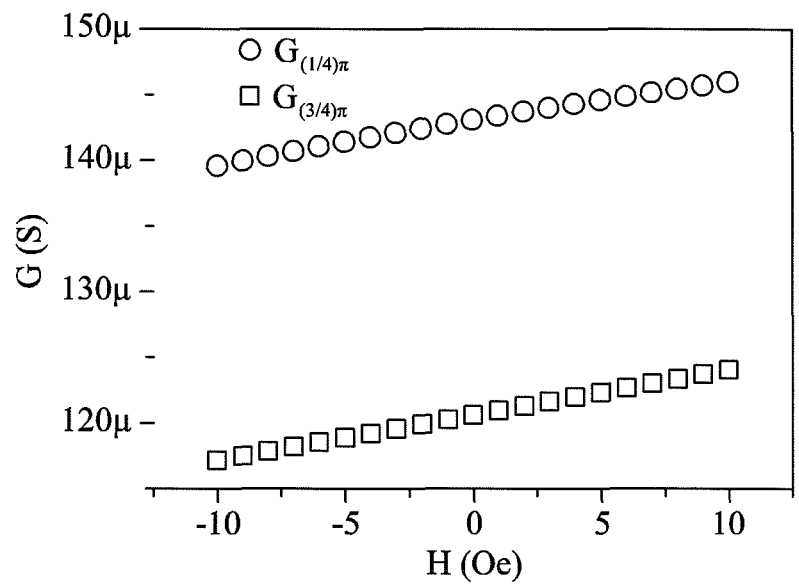
FIG. 3B is a graph depicting the variations in conductance $G_{(1/4)\pi}$ and conductance $G_{(3/4)\pi}$ of the X-axis sensor with a X-axis external magnetic field according to the disclosure.
Figure 3C:
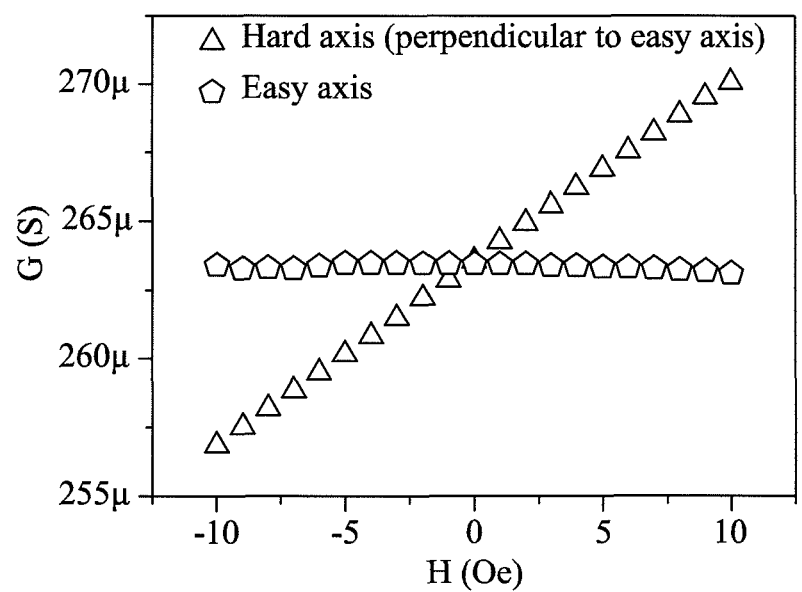
FIG. 3C is a graph depicting parallel signals of the X-axis sensor sensing an X-axis magnetic field and a Y-axis magnetic field according to the disclosure.

FIG. 3B is a graph depicting the measurement results of conductance G (conductance $G_{(1/4)\pi}$ and conductance $G_{(3/4)\pi}$) when an external magnetic field is applied to the hard axis (i.e. an X-axis magnetic field is applied) of the X-axis magnetic field sensor. FIG. 3C is a graph depicting parallel signals of the X-axis magnetic field sensor sensing a hard-axis (X-axis) magnetic field (shown with triangular markers) and parallel signals of the Y-axis magnetic field sensor sensing a easy-axis (Y-axis) magnetic field (shown with pentagonal markers). Since the parallel signal G values sensed by the X-axis and Y-axis magnetic field sensors are considerably different, and X(Y)-axis tunneling magneto-resistance magnetic field sensor signals are not easily influenced by the Y(X)-axis magnetic field, signals can be sensed with single directivity, and horizontal biaxial magnetic field sensor elements can be produced by the production process or the packaging technology. Therefore, a biaxial magnetic field sensor can be designed according to the magnetic field sensor of the disclosure, that is, two magnetic field sensors has a 90-degree angle (as shown in FIG. 3A) for measuring changes in magnetic field in the X-axis direction and the Y-axis direction.

The aforementioned magnetic field sensor can be used for the X-axis sensor or the Y-axis sensor. When there is a change of the external magnetic field, changes in the parallel conductance value G of the X-axis and Y-axis sensors can be obtained for sensing. For convenience of description, the influences of different free layer structures on sensitivity will be described below using the X-axis sensor as an example.

Figure 4:
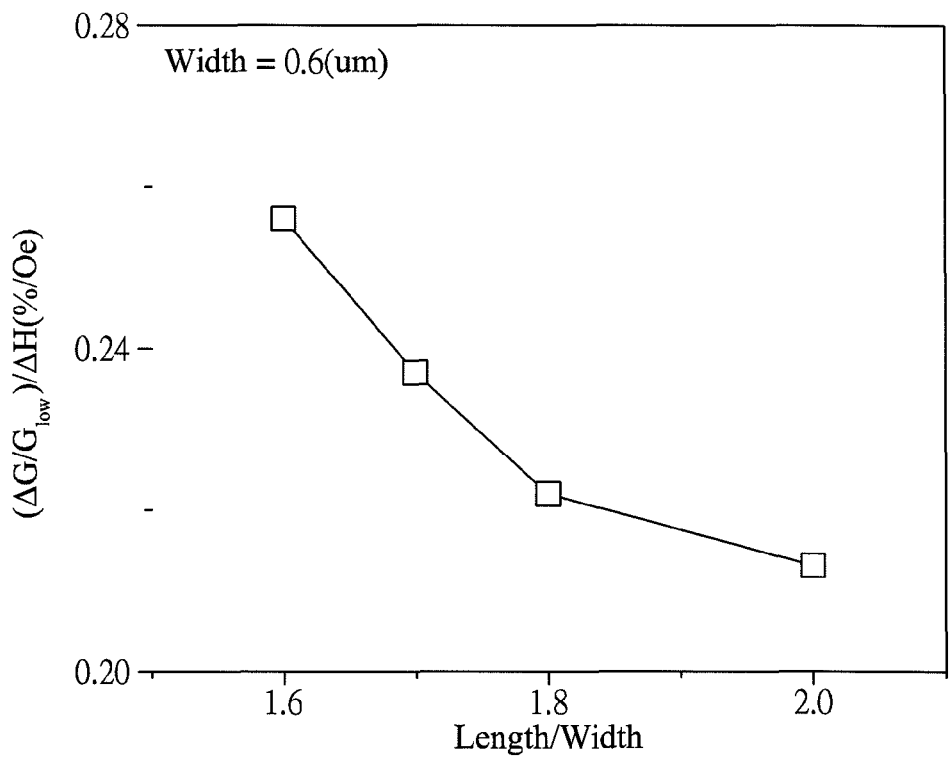
FIG. 4 is a graph depicting variations in sensitivity of the X-axis sensor with different aspect ratios when the minor axis width of the MTJ element is fixed at 0.6 um according to the disclosure.

FIG. 4 shows a graph depicting the variations in sensitivity of the X-axis sensor with different aspect ratios (length/width) when the minor axis width of the MTJ element is fixed at 0.6 um. Referring to FIG. 2 and FIG. 4, in an exemplary embodiment, the free layer 26 of the X-axis sensor is a composite free layer, including the free layer 260/the spacer layer 261/the upper free layer 262 made of NiFe/Ta/NiFe, respectively, and the barrier layer 25 is made of aluminum oxide ($AlO_x$). An external magnetic field is applied in the x-axis direction (−10 Oe≤H≤10 Oe). When the minor axis width of the MTJ element is fixed to 0.6 um, the sensitivity decreases with the increase of the aspect ratio from 0.256 (%/Oe) to 0.213 (%/Oe). Therefore, changes in the sensitivity are dependent on the increase of the anisotropy energy as a result of the increase of the aspect ratio.

Figure 5:
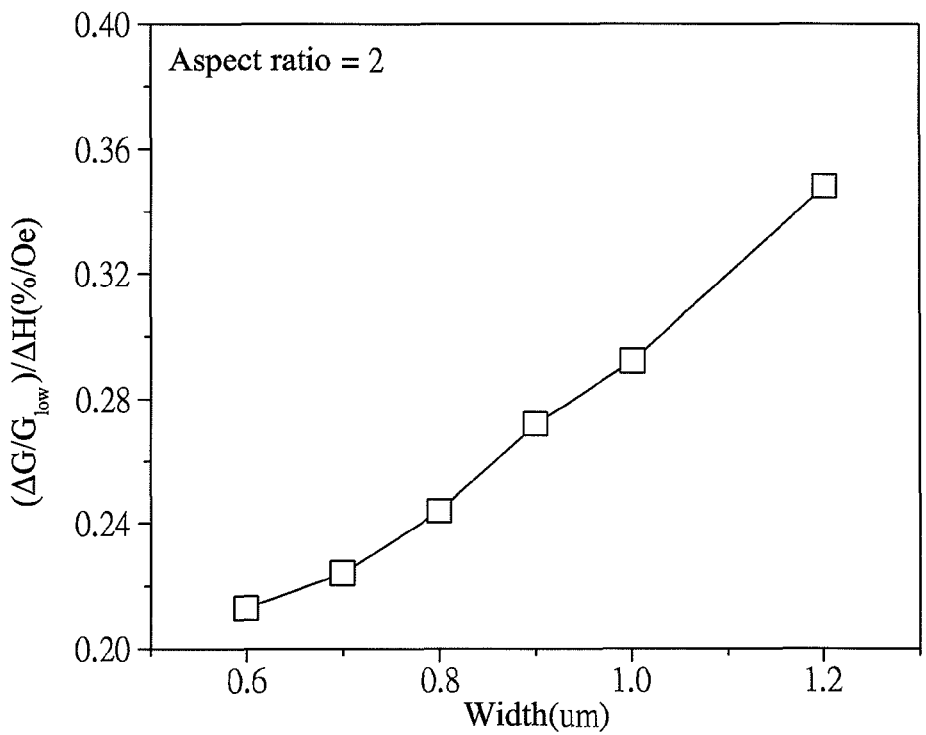
FIG. 5 is a graph depicting variations in sensitivity of the X-axis sensor with different minor axis widths of the MTJ element when the aspect ratio of the MTJ element is fixed according to the disclosure.

FIG. 5 shows a graph depicting variations in sensitivity of the X-axis sensor with different minor axis widths of the MTJ element when the aspect ratio of the MTJ element is fixed. Referring to FIG. 2 and FIG. 5, in an exemplary embodiment, the free layer 26 of the X-axis sensor is a composite free layer, including the free layer 260/the spacer layer 261/the upper free layer 262 made of NiFe/Ta/NiFe, respectively, and the barrier layer 25 is made of aluminum oxide ($AlO_x$). An external magnetic field is applied in the x-axis direction (−10 Oe≤H≤10 Oe). When the aspect ratio of the MTJ element is fixed to 2, the minor axis width increases from 0.6 um to 1.2 um, the sensitivity increases from 0.213 (%/Oe) to 0.348 (%/Oe), that is, the sensitivity increases with the increase of the MTJ element width. This is due to the reduction of demagnetizing field as a result of increase of the element size. Similarly, when the free layer 26 is a single free layer or a synthetic antiferromagnetic free layer, their sensitivities will have the same variation trends, i.e. decrease with the increase of aspect ratio, and increase with the increase of the MTJ element width.

Figure 6:
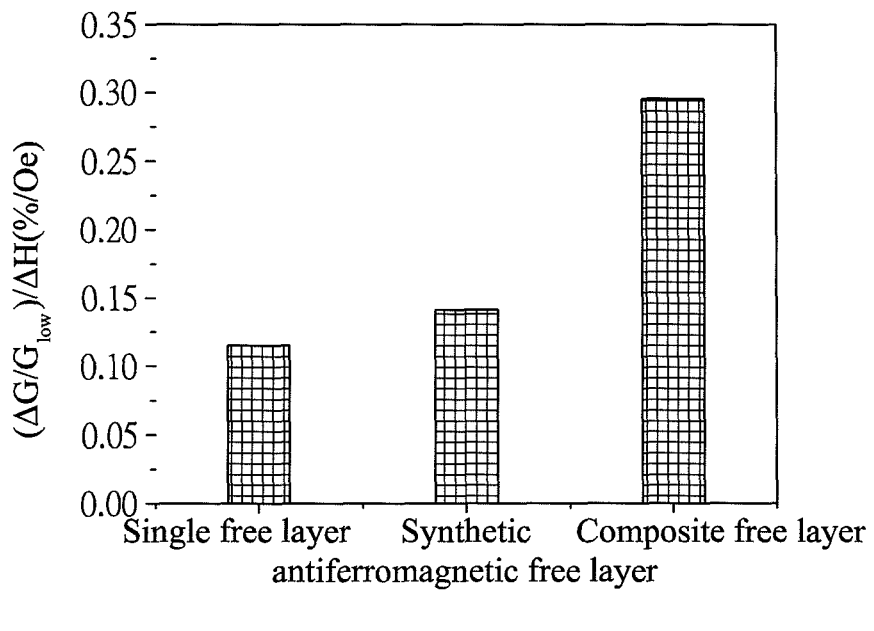
FIG. 6 is a graph depicting the influences of different free layers on the sensitivity of the X-axis sensor under the same manufacturing conditions of the MTJ element and the same total thickness of the NiFe materials according to the disclosure.

FIG. 6 shows a graph depicting the influences of different free layers on the sensitivity of the X-axis sensor under the same manufacturing conditions of the MTJ element and the same total thickness of the NiFe materials. Referring to FIG. 2 and FIG. 6, in an exemplary embodiment, for the X-axis sensor, an X-axis external magnetic field is applied (−20 Oe≤H≤20 Oe), the MTJ element size is fixed to $0.8*1.6\ um^2$, and the barrier layer 25 is magnesium oxide (MgO). Under the same total thickness of the NiFe materials, when the free layer 26 is changed from a synthetic antiferromagnetic free layer containing with 0.8 nm non-magnetic material of Ru to a composite free layer structure containing 0.3 nm non-magnetic material of Ta, the sensitivity to changes in the external magnetic field $(\Delta G/G_{low})/\Delta H$ increases from 0.115 (%/Oe) to 0.295 (%/Oe), wherein the composite free layer has the most obvious improvement in sensitivity (i.e. 2.5 times of increments), and an excellent sensing linearity (R-square≥0.999) is maintained.

Figure 7:
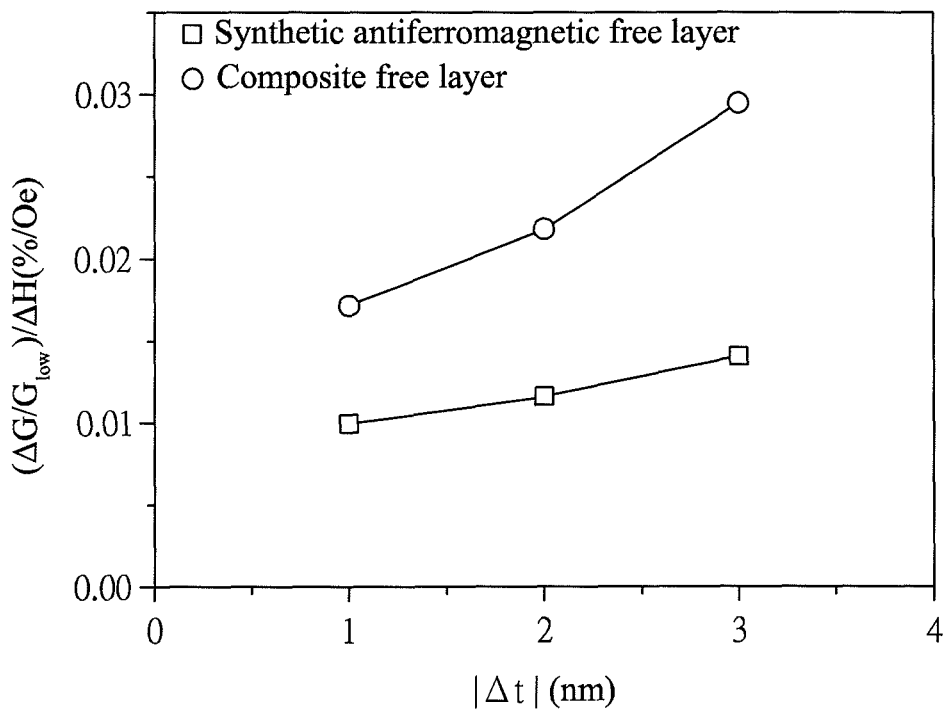
FIG. 7 is a graph depicting the influences of the difference in thicknesses of the free layer on the sensitivity of the X-axis sensor under the same manufacturing conditions of the MTJ element and the same total thickness of the NiFe materials according to the disclosure.

If the free layer is a single free layer, then the switching field increases with the increase of the thickness. Conversely, the sensitivity $(\Delta G/G_{low})/\Delta H$ decreases with the increase of the thickness of NiFe. As for the synthetic antiferromagnetic free layer and the composite free layer, the sensitivity increases with the increase of the difference ($|\Delta T|=|T1-T2|$) between the NiFe thickness of lower free layer 260 (t1) and the NiFe thickness of the upper free layer 262 (t2), from 0.099 (%/Oe) to 0.141 (%/Oe), and from 0.172 (%/Oe) to 0.295 (%/Oe), respectively, as shown in FIG. 7, which illustrates the influences of the difference in thicknesses of the free layer on the sensitivity of the X-axis sensor under the same manufacturing conditions of the MTJ element and the same thickness of Ru/Ta.

From the above, it can be seen that all of the three free layer structures obtain relatively good G-H linear relationship, and have the sensitivities decreasing with the increase of the total NiFe thickness of the free layer 26, but under the same total NiFe thickness of the free layer 26, the composite free layer structure containing non-magnetic Ta has the best sensitivity. For a manufacturing size in the submicron level and a higher aspect ratio, the composite free layer and the synthetic antiferromagnetic free layer structures also have better thermal stability.

Figure 8:
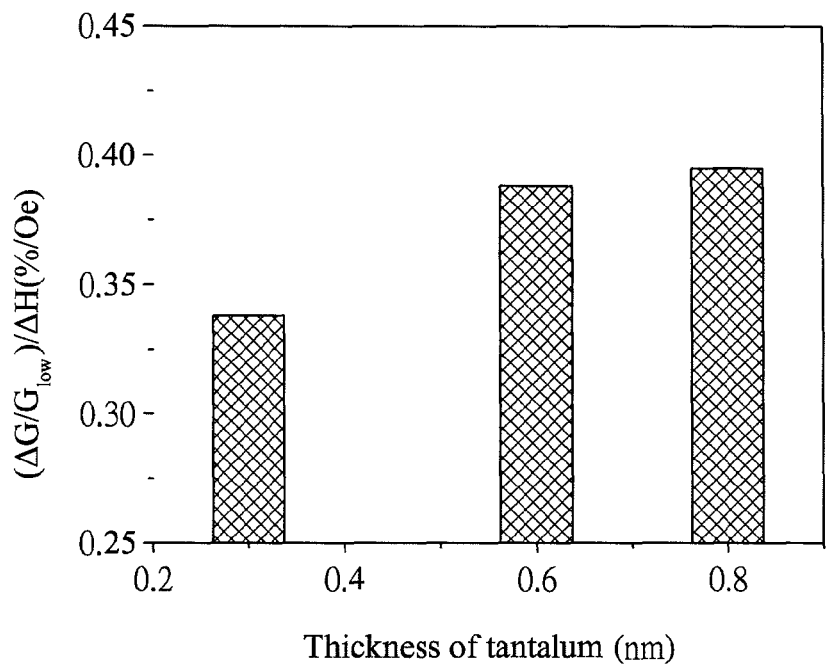
FIG. 8 is a graph depicting the influences of the thickness of the Ta spacer layer on the sensitivity of the X-axis sensor under the same manufacturing conditions of the MTJ element and the same total NiFe thickness of the two free layers according to the disclosure.

In an exemplary embodiment, the influences of the thickness of the spacer layer (Ta) on the sensitivity of the X-axis sensor under the same manufacturing conditions of the MTJ element and the same total NiFe thickness of the two free layers are illustrated in FIG. 8. Referring to FIG. 2 and FIG. 8, for the X-axis sensor, the MTJ element size is $1*2\ um^2$; the barrier layer 25 is $AlO_x$; the free layer 260/the spacer layer 261/the upper free layer 262 are made of NiFe/Ta/NiFe, respectively, wherein the thickness of Ta is t1, and the NiFe thickness of the lower free layer 260 and the upper free layer 262 is fixed. When an external magnetic field is applied in the x-axis direction, the thickness of non-magnetic Ta increases from 0.3 nm to 0.8 nm, and the sensitivity increases from 0.338 (%/Oe) to 0.395 (%/Oe). Ta is too thin to form continuous films, and thus causes interlayer roughness and creates local ferromagnetic exchange coupling or Néel coupling effect. Once the thickness of Ta increases, above adverse situations are lessened.

Figure 9:
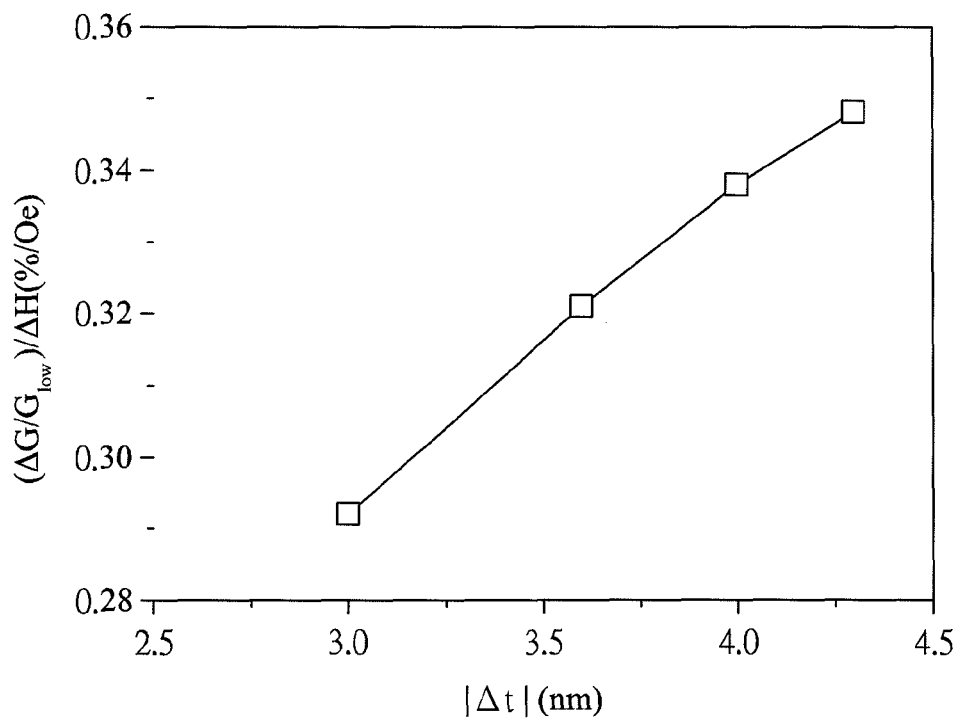
FIG. 9 is a graph depicting the influences of the difference in thicknesses of the free layer on the sensitivity of the X-axis sensor under the same manufacturing conditions of the MTJ element and the same total thickness of the NiFe materials according to the disclosure.

Likewise, in an exemplary embodiment, for the synthetic antiferromagnetic free layer containing 0.3 nm non-magnetic Ta, when the barrier layer 25 is $AlO_x$, the sensitivity increases with the increase of the difference ($|\Delta T|=|T1-T2|$) between the NiFe thicknesses, from 0.292 (%/Oe) to 0.348 (%/Oe), as shown in FIG. 9, which illustrates the influences of the difference in thicknesses of the free layer on the sensitivity of the X-axis sensor under the same manufacturing conditions of the MTJ element and the same thickness of Ta.

The disclosure proposes a magnetic field sensor for sensing an external magnetic field. By employing various free layers, high sensitivity and linearity for sensing the external magnetic field can be achieved.

Compared to the prior art, the magnetic field sensor of the present disclosure may have different combinations in the free layer structure, such as a single free layer, a composite free layer, a synthetic antiferromagnetic free layer or an alloy free layer, etc. The free layer is used as the sensing layer of the magnetic field sensor. When the direction of the magnetic moment of the sensing layer is changed due to an external magnetic field, a parallel conductance value G that varies with the external magnetic field can also be obtained. Particularly, the composite free layer has a sensing sensitivity value of about 0.395 (%/Oe) and conductance values G exhibiting high linearity (R-square≥0.999), and thus significantly improves the sensing linearity and sensitivity of the magnetic field sensor.

In summary, the disclosure provides a magnetic field sensor for sensing an external magnetic field, wherein a free layer may be a single free layer, a composite free layer, a synthetic antiferromagnetic free layer or an alloy free layer, etc. The magnetic field sensor of the disclosure significantly improves the sensitivity and linearity of complementary tunneling magneto-resistive sensor structure. When the composite free layer is used, the sensitivity value of about 0.395 (%/Oe) and conductance values G exhibiting high linearity are achieved. The improvement to the free layer in the magnetic field sensor for sensing an external magnetic field indeed increases the linearity and sensitivity of the magnetic field sensor in the disclosure.

The above embodiments are only used to illustrate the principles of the disclosure, and should not be construed as to limit the disclosure in any way. The above embodiments can be modified by those with ordinary skill in the art without departing from the scope of the disclosure as defined in the following appended claims.

What is claimed is:

1. A biaxial magnetic field sensor, comprising:
a first magnetic field sensor having a first fixed direction and a first reference axis; and
a second magnetic field sensor having a second fixed direction and a second reference axis, the first and the second reference axes form a 90-degree angle, and the first and the second fixed directions are parallel to each other and form 45-degree angles with the first and the second reference axes, respectively,
wherein the first magnetic field sensor includes:
a first electrode and a second electrode disposed on a first substrate;
a first magnetic tunneling junction (MTJ) element and a second MTJ element disposed between and connected in parallel with the first and the second electrodes, the first and the second MTJ elements being disposed along the first reference axis of the first magnetic field sensor, wherein the first MTJ element includes a first antiferromagnetic layer having a first pinned magnetic moment in the first fixed direction, a first free layer having a first free magnetic moment and a barrier layer formed between the first antiferromagnetic layer and the first free layer, and the first free layer is a multilayer structure, and wherein the second MTJ element includes a second antiferromagnetic layer having a second pinned magnetic moment in the first fixed direction, a second free layer having a second magnetic moment and a barrier layer formed between the second antiferromagnetic layer and the second free layer, and the second free layer is a multilayer structure; and
a first metal circuit passing over or below the first and the second MTJ elements, such that the first free magnetic moment and the second free magnetic moment are anti-parallel to each other along the first reference axis, and the first pinned magnetic moment and the second pinned magnetic moment form angles of 45 or 135 degrees with the first reference axis, respectively, and a magnetic field sensing direction of the first magnetic field sensor is perpendicular to the first reference axis,
wherein the second magnetic field sensor includes:
a third electrode and a fourth electrode disposed on a second substrate;
a third MTJ element and a fourth MTJ element disposed between and connected in parallel with the third and the fourth electrodes, the third and the fourth MTJ elements being disposed along the second reference axis of the second magnetic field sensor, wherein the third MTJ element includes a third antiferromagnetic layer having a third pinned magnetic moment in the second fixed direction, a third free layer having a third free magnetic moment and a barrier layer formed between the third antiferromagnetic layer and the third free layer, and the third free layer is a multilayer structure, and wherein the fourth MTJ element includes a fourth antiferromagnetic layer having a fourth pinned magnetic moment in the second fixed direction, a fourth free layer having a fourth free magnetic moment and a barrier layer formed between the fourth antiferromagnetic layer and the fourth free layer, and the fourth free layer is a multilayer structure; and
a second metal circuit passing over or below the third and the fourth MTJ elements, such that the third free magnetic moment and the fourth free magnetic moment are anti-parallel to each other along the second reference axis, and the third pinned magnetic moment and the fourth pinned magnetic moment form angles of 45 or 135 degrees with the second reference axis, respectively, and a magnetic field sensing direction of the second magnetic field sensor is perpendicular to the second reference axis.

2. The biaxial magnetic field sensor of claim 1, wherein the first, the second, the third and the fourth antiferromagnetic layers each includes a synthetic antiferromagnetic layer having a pinned layer, a ruthenium layer and a reference layer.

3. The biaxial magnetic field sensor of claim 1, wherein the first, the second, the third and the fourth free layers each includes a composite free layer having an upper free layer, a spacer layer and a lower free layer.

4. The biaxial magnetic field sensor of claim 3, wherein the upper and the lower free layers are made of a material selected from the group consisting of NiFe, NiFeTa, NiFeCoTa, NiFeRu, NiFeCoRu, $(NiFe/Ta)_m$, $(NiFe/Ru)_m$, $(NiFeCo/Ta)_m$ and $(NiFeCo/Ru)_m$, the spacer layer includes tantalum having a thickness of 0.1 nm to 1 nm, and the upper and the lower free layers are coupled in parallel.

5. The biaxial magnetic field sensor of claim 3, wherein the upper and the lower free layers are made of a material selected from the group consisting of NiFe, NiFeTa, NiFeCoTa, NiFeRu, NiFeCoRu, $(NiFe/Ta)_m$, $(NiFe/Ru)_m$, $(NiFeCo/Ta)_m$, and $(NiFeCo/Ru)_m$, the spacer layer includes ruthenium having a thickness of 0.2 nm to 0.4 nm, and the upper and the lower free layers are strongly coupled in parallel.

6. The biaxial magnetic field sensor of claim 3, wherein the upper and the lower free layers are made of materials selected from the group consisting of NiFe, NiFeTa, NiFeCoTa, NiFeRu, NiFeCoRu, $(NiFe/Ta)_m$, $(NiFe/Ru)_m$, $(NiFeCo/Ta)_m$ and $(NiFeCo/Ru)_m$, the spacer layer includes ruthenium having a thickness of 1.2 nm to 1.6 nm, and the upper and the lower free layers are weakly coupled in parallel.

7. The biaxial magnetic field sensor of claim 1, wherein the first, the second, the third and the fourth free layers each includes a synthetic antiferromagnetic free layer having an upper free layer, a spacer layer and a lower free layer.

8. The biaxial magnetic field sensor of claim 7, wherein the upper and the lower free layers are made of a material selected from the group consisting of NiFe, NiFeTa, NiFeCoTa, NiFeRu, NiFeCoRu, $(NiFe/Ta)_m$, $(NiFe/Ru)_m$, $(NiFeCo/Ta)_m$ and $(NiFeCo/Ru)_m$, the spacer layer includes ruthenium having a thickness of 0.6 am to 1 nm, and the upper and the lower free layers are strongly coupled in anti-parallel.

9. The biaxial magnetic field sensor of claim 7, wherein the upper and the lower free layers are made of a material selected from the group consisting of NiFe, NiFeTa, NiFeCoTa, NiFeRu, NiFeCoRu, $(NiFe/Ta)_m$, $(NiFe/Ru)_m$, $(NiFeCo/Ta)_m$ and $(NiFeCo/Ru)_m$, the spacer layer includes ruthenium having a thickness of 1.9 nm to 2.3 nm, and the upper and the lower free layers are weakly coupled in anti-parallel.

10. A biaxial magnetic field sensor, comprising:
a first magnetic field sensor having a first fixed direction and a first reference axis; and
a second magnetic field sensor having a second fixed direction and a second reference axis, the first and the second reference axes form a 90-degree angle, and the first and the second fixed directions are parallel to each other and form 45-degree angles with the first and the second reference axes, respectively,
wherein the first magnetic field sensor includes:
 a first electrode and a second electrode disposed on a first substrate;
 a first magnetic tunneling junction (MTJ) element and a second MTJ element disposed between and connected in parallel with the first and the second electrodes, the first and the second MTJ elements being disposed along the first reference axis of the first magnetic field sensor, wherein the first MTJ element includes a first antiferromagnetic layer having a first pinned magnetic moment in the first fixed direction, a first free layer having a first free magnetic moment and a barrier layer formed between the first antiferromagnetic layer and the first free layer, and the first antiferromagnetic layer includes a synthetic antiferromagnetic layer having a pinned layer, a ruthenium layer and a reference layer, and wherein the second MTJ element includes a second antiferromagnetic layer having a second pinned magnetic moment in the first fixed direction, a second free layer having a second free magnetic moment and a barrier layer formed between the second antiferromagnetic layer and the second free layer, and the second antiferromagnetic layer includes a synthetic antiferromagnetic layer having a pinned layer, a ruthenium layer and a reference layer; and
 a first metal circuit passing over and below the first and the second MTJ elements, such that the first free magnetic moment and the second free magnetic moment are anti-parallel to each other along the first reference axis, and the first pinned magnetic moment and the second pinned magnetic moment form angles of 45 or 135 degrees with the first reference axis, respectively, and a magnetic field sensing direction of the first magnetic field sensor is perpendicular to the first reference axis,
wherein the second magnetic field sensor includes:
 a third electrode and a fourth electrode disposed on a second substrate;
 a third MTJ element and a fourth MTJ element disposed between and connected in parallel with the third and the fourth electrodes, the third and the fourth MTJ elements being disposed along the second reference axis of the second magnetic field sensor, wherein the third MTJ element includes a third antiferromagnetic layer having a third pinned magnetic moment in the second fixed direction, a third free layer having a third free magnetic moment and a barrier layer formed between the third antiferromagnetic layer and the third free layer, and the third antiferromagnetic layer includes a synthetic antiferromagnetic layer having a pinned layer, a ruthenium layer and a reference layer, and wherein the fourth MTJ element includes a fourth antiferromagnetic layer having a fourth pinned magnetic moment in the second fixed direction, a fourth free layer having a fourth free magnetic moment and a barrier layer formed between the fourth antiferromagnetic layer and the fourth free layer, and the fourth antiferromagnetic layer includes a synthetic antiferromagnetic layer having a pinned layer, a ruthenium layer and a reference layer; and
 a second metal circuit passing over or below the third and the fourth MTJ elements, such that the third free magnetic moment and the fourth free magnetic moment are anti-parallel to each other along the second reference axis, and the third pinned magnetic moment and the fourth pinned magnetic moment form angles of 45 or 135 degrees with the second reference axis, respectively, and a magnetic field sensing direction of the second magnetic field sensor is perpendicular to the second reference axis.

11. The biaxial magnetic field sensor of claim 10, wherein the first, the second, the third and the fourth free layers each includes nickel-iron (NiFe) having a thickness of 2 nm to 10 nm.

12. The biaxial magnetic field sensor of claim 10, wherein the first, the second, the third and the fourth free layers each includes NiFeTa, NiFeRu, NiFeCoTa or NiFeCoRu alloy.

* * * * *